United States Patent
Yasuda et al.

(10) Patent No.: US 6,952,461 B2
(45) Date of Patent: Oct. 4, 2005

(54) SAMPLING FREQUENCY CONVERSION APPARATUS

(75) Inventors: Nobuyuki Yasuda, Chiba (JP); Kazunobu Ohkuri, Kanagawa (JP)

(73) Assignee: Sony Corporation, Tokyo (JP)

( * ) Notice: Subject to any disclaimer, the term of this patent is extended or adjusted under 35 U.S.C. 154(b) by 771 days.

(21) Appl. No.: 10/007,837

(22) Filed: Nov. 8, 2001

(65) Prior Publication Data

US 2002/0122518 A1 Sep. 5, 2002

(30) Foreign Application Priority Data

Nov. 16, 2000 (JP) ..................................... P2000-349800

(51) Int. Cl.⁷ ................................................ H04L 7/00
(52) U.S. Cl. ....................... 375/372; 375/275; 375/355; 341/61; 341/123
(58) Field of Search ............................ 375/355, 240.21, 375/240.58, 275, 354, 251, 372, 345, 350, 143; 341/106, 61, 141, 150; 711/110

(56) References Cited

U.S. PATENT DOCUMENTS 5,191,334 A * 3/1993 Yasuda ........................ 341/61
5,835,032 A * 11/1998 Yasuda ........................ 341/61
5,982,305 A * 11/1999 Taylor ......................... 341/61
5,996,044 A * 11/1999 Yasuda ....................... 711/110

* cited by examiner

Primary Examiner—Shuwang Liu
Assistant Examiner—Ted M. Wang
(74) Attorney, Agent, or Firm—Jay H. Maioli

(57) ABSTRACT

A sampling frequency conversion apparatus which easily controls the phase difference (time difference) between the input data and the output data in converting the sampling frequency, includes a storage device 13 for continuously writing the input data or the data obtained by over-sampling the input data and for continuously reading out the data written maintaining a predetermined address difference relative to the writable address, and an interpolation processing unit 14 for interpolating the data read-out from the storage device 13 to obtain data of which the sampling frequency is converted. In converting the sampling frequency, an address difference between a writable address and a readable address in the storage device 13 is optimized, the address difference being optimized without limitation for a predetermined period of time from the start of supplying the input data and, then, being optimized by imposing a predetermined limitation after the passage of the predetermined period of time.

8 Claims, 6 Drawing Sheets

SAMPLING FREQUENCY CONVERSION APPARATUS

BACKGROUND OF THE INVENTION

1. Field of the Invention

The present invention relates to a sampling frequency conversion apparatus for converting the sampling frequency of digital data such as digital audio data.

2. Description of Related Art

In recent years, there have been into a practical use a variety of recording media capable of recording digital audio data in a digital form. It is further becoming a common practice to transmit digitized audio data as broadcast data and as data to be transmitted for internet.

Here, the digital audio data are the digitized data obtained by sampling the analog audio signals at a predetermined sampling frequency, and there have been employed a plurality of sampling frequencies. For example, a sampling frequency of 44.1 kHz is used for the digital audio data recorded in an optical disk called compact disk (CD) and for the digital audio data recorded in a magneto-optical disk called mini-disk (MD). The digital audio data recorded in a magnetic tape called digital audio tape (DAT) use the sampling frequencies of 32 kHz and 48 kHz in addition to the above-mentioned sampling frequency of 44.1 kHz. Other systems may use a sampling frequency of 96 kHz.

A processing for converting the sampling frequency becomes necessary when it is attempted to record the digital audio data reproduced from these media into another medium having a different sampling frequency. In recent years, further, there have been developed a variety of audio processing apparatuses capable of adjusting the tone quality of audio signals and sound field, and the processings in such processing apparatuses have been executed by using a circuit called digital signal processor (DSP). When the sampling frequency for the digital audio data that are input is different from the sampling frequency treated by the apparatus, however, the sampling frequency must be converted.

The simplest processing for converting the sampling rate may be to once convert the input digital data into analog signals, and to convert the thus converted analog signals again to the digital data at a required sampling frequency. However, this kind of conversion into analog signals is inevitably accompanied by a problem of deterioration in the signal characteristics. It has therefore been attempted to convert the sampling frequency in the operation processing while maintaining the digital data.

According to the processing for converting the sampling frequency while maintaining the digital data, the sampling position in the output data is judged based on a ratio of sampling frequencies for the input data and for the output data, and the audio data at the thus judged sampling position is found by an operation of interpolating the input data before and after the sampling position. Thus, the sampling frequency of the digital data is converted by the digital operation of converting the sampling frequency into the digital data minimizing the deterioration of tone quality.

When the sampling frequency is to be converted by the digital operation, a buffer memory is necessary for accumulating the input data to some extent in a step prior to executing the interpolation operation. The buffer memory must execute a processing to continuously write the input data and to continuously read out the data that are written and accumulated. The memory which continuously writes and reads the data is called ring buffer or the like since the writing address and the reading address change periodically and cyclically.

When the above ring buffer is used, the writing address and the reading address must be separated away from each other to a certain extent or the buffer does not effectively work. Therefore, the ring buffer is so controlled that the writing address and the reading address have values that are separated away from each other within a given range. The sampling frequency is converted by a sampling frequency conversion circuit equipped with the above-mentioned buffer. Therefore, the data of which the sampling frequency is converted involve a delay of timing from when the data is at least written into the buffer until when it is read out.

The digital audio data in many cases have a multi-channel constitution such as of two channels or more channels. For example, the audio data chiefly for movies are constituted by 6 channels including two front channels, a center channel, two rear channels and a woofer channel LFE (Low Frequency Effects)(which, however, is often called 5.1 channels regarding the LFE channel as 0.1 channel).

Here, when the multi-channel digital audio data are to be converted by using the above-mentioned circuit (apparatus) that converts the sampling frequency, the phases of the channels must be correctly set so as to eliminate a phase difference (time difference) of the channels. If the phases of the channels are not correctly set, the sound field is disturbed when the multi-channel audio data are reproduced, which is not desirable. However, as described above, the sampling frequency conversion circuit, in principle, requires a buffer memory. In order to control the delay time caused by employing the buffer memory to become uniform for all of the channels, a complex control operation is necessary for synchronizing the write and read of the memory for all of the channels, which results in a large-scale constitution of the sampling frequency conversion apparatus.

Even when a multi-channel constitution is not employed, it may become necessary to bring the data of which the sampling frequency is converted into synchronism with an external timing due to some cause. In such a case, too, a complex operation is required for controlling the writing and reading of the buffer memory.

SUMMARY OF THE INVENTION

The present invention was accomplished in view of the above-mentioned circumstances, and its object is to easily control the phase difference (time difference) between the input data and the output data in converting the sampling frequency.

The present invention is concerned with a sampling frequency conversion apparatus comprising storage means into which are continuously written the input data or the data obtained by over-sampling the input data and from which are continuously read out the data that are written having a predetermined address difference relative to the write address, and interpolation processing means for interpolating the data read out from the storage means to obtain data of which the sampling frequency is converted, wherein an address difference is optimized between the write address and the read address in the storage means, the address difference being optimized without limitation for a predetermined period of time after the start of feeding the input data and, then, the address difference being optimized with a imposed predetermined limitation after the predetermined period of time has passed.

According to the present invention, a difference between the write address and the read address is optimized for a predetermined period of time after the start of feeding the input data, and the address difference is optimized within that predetermined period of time, so that a phase difference (time difference) between the input data and the output data becomes nearly constant with an optimum address difference. After the predetermined period of time has passed, the address difference is optimized in a state of being imposed with a predetermined limitation.

DESCRIPTION OF THE PREFERRED EMBODIMENT

An embodiment of the present invention will now be described with reference to the accompanying drawings.

In this embodiment, the invention is applied to an apparatus that converts the sampling frequencies of audio data of each of the input channels in an audio amplifier apparatus that processes digital audio data of multiplicity of channels. The audio amplifier apparatus of this embodiment is called digital amplifier which forms PWM (Pulse Width Modulation) signals based upon the digital audio data that are supplied, effects the direct switching operation for a predetermined power source relying upon the PWM signals to obtain amplified outputs for driving the speakers.

In this embodiment, the digital audio data for forming the PWM signals in the audio amplifier apparatus must have a particular sampling frequency. The amplifier apparatus is provided with a sampling frequency converter for converting the sampling frequency when the sampling frequency of the digital audio data input from an external unit is not the particular sampling frequency.

Figure 1:
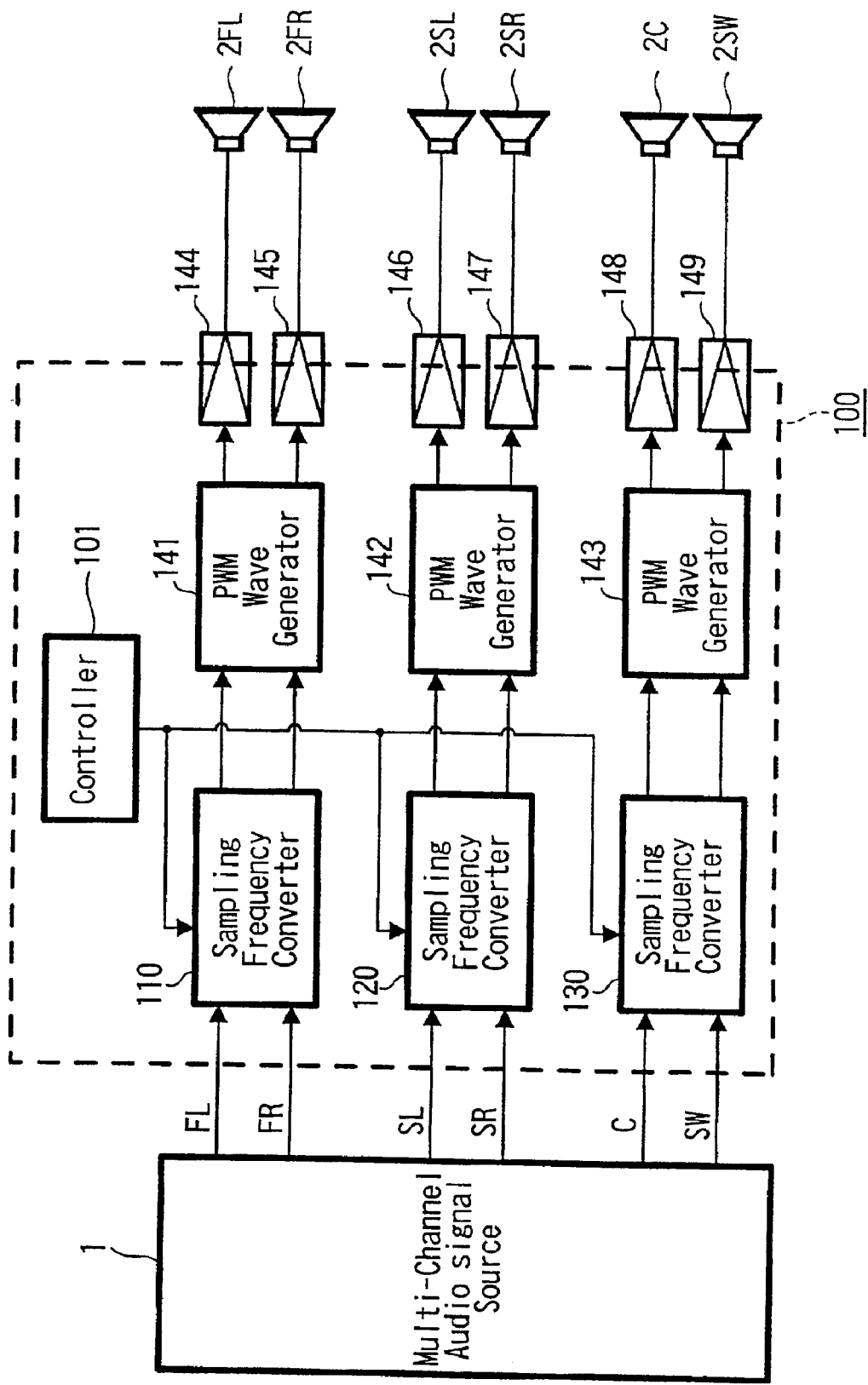
FIG. 1 is a block diagram illustrating the whole constitution of an embodiment of the present invention.

FIG. 1 is a diagram illustrating the whole constitution of the audio amplifier apparatus according to the embodiment. A multi-channel audio signal source 1 is connected to an audio amplifier apparatus 100, and multi-channel digital audio data of 6 channels are supplied to the audio amplifier apparatus 100 from the multi-channel audio signal source 1. A concrete channel constitution includes, for example, a front left signal FL, a front right signal FR, a rear left signal SL, a rear right signal SR, a center signal C, and a woofer signal SW.

The audio data of each of the channels supplied to the audio amplifier apparatus 100 are sent to sampling frequency converters 110, 120 and 130. The sampling frequency converters 110, 120 and 130 in the audio amplifier apparatus 100 in this embodiment are each capable of converting audio data of two channels. Therefore, a total of three converters 110, 120 and 130 are capable of converting sampling frequencies of the multi-channel audio data of 6 channels. Concretely speaking, the first converter 110 converts the front left signal FL and the front right signal FR, the second converter 120 converts the rear left signal SL and the rear right signal SR, and the third converter 130 converts the center signal C and the woofer signal SW.

Here, a controller 101 which controls the whole operation of the amplifier apparatus 100 supplies limit reset signals, that will be described later, to the converters 110, 120 and 130 to equalize the phase difference (time difference) that generates accompanying the conversion through the three converters 110, 120 and 130. The processing using the limit reset signals will be described later in detail.

When the sampling frequency of audio data input to the audio amplifier apparatus 100 is equal to the sampling frequency of data used for the amplification processing in the amplifier apparatus 100, the converters 110, 120 and 130 produce the input data unchanged and do not execute the processing for converting the sampling frequency.

However, the input audio data may contain jittering, and the sampling frequency may fluctuate to a small degree. Therefore, the sampling frequency may be converted even when the sampling frequency of the input audio data is equal to the sampling frequency of the output data.

The digital audio data of the channels of which the sampling frequencies are converted (or are not converted since they need not be converted) through the sampling frequency converters 110, 120 and 130, are supplied to PWM wave generator circuits 141, 142 and 143 which generate PWM signals (PWM waves) of which the pulse widths are modulated with audio data of each of the channels. The PWM wave generator circuits 141, 142 and 143, too, are each capable of processing two channels.

The formed PWM signals of each of the channels are supplied to amplifier circuits 144, 145, 146, 147, 148 and 149 of each of the channels, and are processed so as to obtain amplified analog audio signals. The amplifier circuits 144 to 149 switch the stabilized DC power source with the above-mentioned PWM signals, subject the switching outputs to a processing for removing DC components and high-frequency components through circuits constituted by pulse transformers and low-pass filters to finally obtain the amplified audio signals.

The audio signals output from the amplifier circuits 144 to 149 of each of the channels are supplied to speaker units of each of the channels connected to the speaker connection terminals (not shown) of the audio amplifier apparatus 100 to produce multi-channel audio outputs. That is, the output of the amplifier circuit 144 is supplied to the speaker unit 2FL for the front left channel, the output of the amplifier circuit 145 is supplied to the speaker unit 2FR for the front right channel, the output of the amplifier circuit 146 is supplied to the speaker unit 2SL for the rear left channel, the output of the amplifier circuit 147 is supplied to the speaker unit 2SR for the rear right channel, the output of the amplifier circuit 148 is supplied to the speaker unit 2C for the center channel, and the output of the amplifier circuit 149 is supplied to the speaker unit 2SW for the woofer channel.

Next, described below are concrete constitutions of the sampling frequency converters 110, 120 and 130. In the following description, each sampling frequency converter is so constituted as to process the data of one channel only for easy explanation. However, the above-mentioned sampling frequency converters 110, 120 and 130 are each so constituted as to process the data of two channels.

Figure 2:
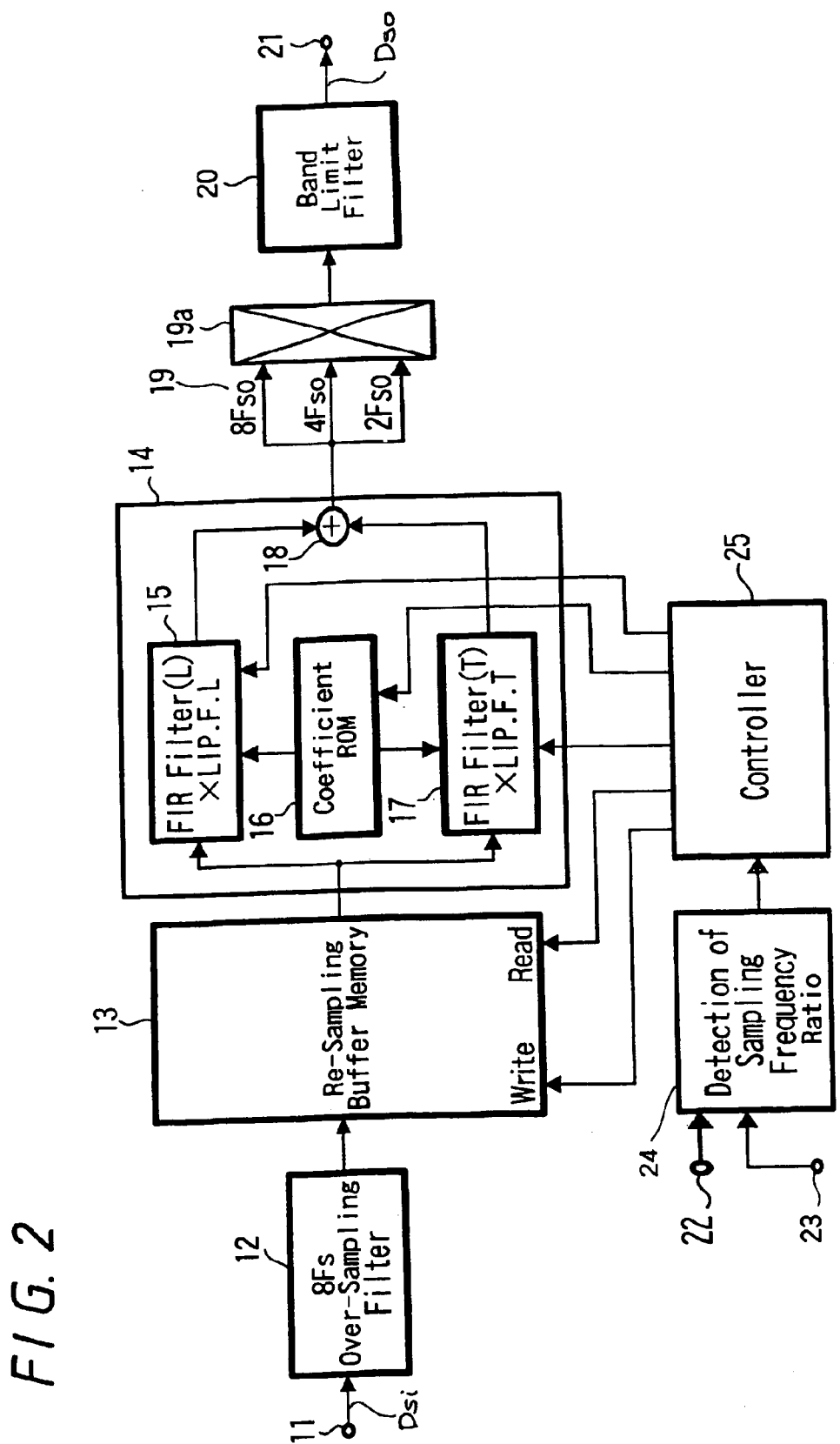
FIG. 2 is a block diagram illustrating the constitution of a sampling frequency conversion unit according to the embodiment of the present invention.

FIG. 2 is a diagram illustrating the whole constitution of a sampling frequency converter according to the embodiment. In this embodiment, the sampling frequency Fsi of the signals Dsi input through the input terminal 11 is re-sampled and is converted into a given sampling frequency Fso. In the following description, the sampling frequency Fsi of the input signals Dsi is regarded to be an input sampling frequency Fsi, and the given sampling frequency Fso is regarded to be an output sampling frequency Fso.

The sampling frequency conversion unit of this embodiment includes an 8Fs over-sampling filter 12 for over-sampling the input signals Dsi of the input sampling frequency Fsi input through the input terminal 11 into 8Fsi for re-sampling, a re-sampling buffer memory 13 for writing and reading the input signals that are rendered to be 8Fsi through the 8Fs over-sampling filter 12, and an interpolation processing circuit 14 for interpolating the output signals of the re-sampling buffer memory 13.

The sampling frequency conversion unit further includes a sampling frequency ratio detector circuit 24 having an improved resolving power for detecting the sampling frequency ratio by counting the period t (=N·Tso) which is N times as long as the period (hereinafter referred to as output sampling period) Tso of the output sampling frequency Fso supplied through an input terminal 23 with an input reference clock (hereinafter referred to as input master clock) MCKi (=M·Fsi) which is an integer times as long as the input sampling frequency Fsi supplied through an input terminal 22, and includes a controller 25 which controls the write and read of the re-sampling buffer memory 13 based on the sampling frequency ratio detected by the sampling frequency ratio detector circuit 24 and controls the interpolation processing by the interpolation processing circuit 14.

The sampling frequency conversion unit further includes a re-sampling frequency signal output circuit 19 for producing sampling frequencies of, for example, 2, 4 and 8 times as high as the output sampling frequency Fso by thinning out the sampling frequency of output signals from the interpolation processing circuit 14 of which the interpolation processing is controlled by the controller 25 and for switching and selecting one of them through a multiplexer 19a, and a band limit filter 20 which imposes a limitation on the band of the output signals from the re-sampling frequency signal output circuit 19 so will not to generate aliasing noise, and produces output signals Dso of the output sampling frequency Fso from an output terminal 21.

Digital signals of the sampling frequency 8Fsi formed by the 8Fs over-sampling filter 12 are input to the re-sampling buffer memory 13 as described above. The re-sampling buffer memory 13 is a ring buffer memory in which a difference of the read address from the write address changes arbitrarily to continuously record the data in the storage medium and to continuously reproduce the data. The re-sampling buffer memory 13 has a capacity of, for example, 20-bits/64-words, and serves as a buffer 8 times of the input sampling frequency time (period) FsiT.

The writing of data into, and the reading of data from, the re-sampling buffer memory 13 are controlled by the controller 25. The controller 25 supplies a write address for writing data into the re-sampling buffer memory 13, and controls the write and read of the re-sampling buffer memory 13 by supplying a read address for reading data to the re-sampling buffer memory 13 from the sampling frequency ratio detected by the sampling frequency ratio detector circuit 24. Therefore, the controller 25 and the sampling frequency ratio detector circuit 24 constitute a memory address control unit for controlling the address of the re-sampling buffer memory 13 and, further, constitutes an interpolation processing control unit for controlling the interpolation processing circuit 14.

Figure 3:
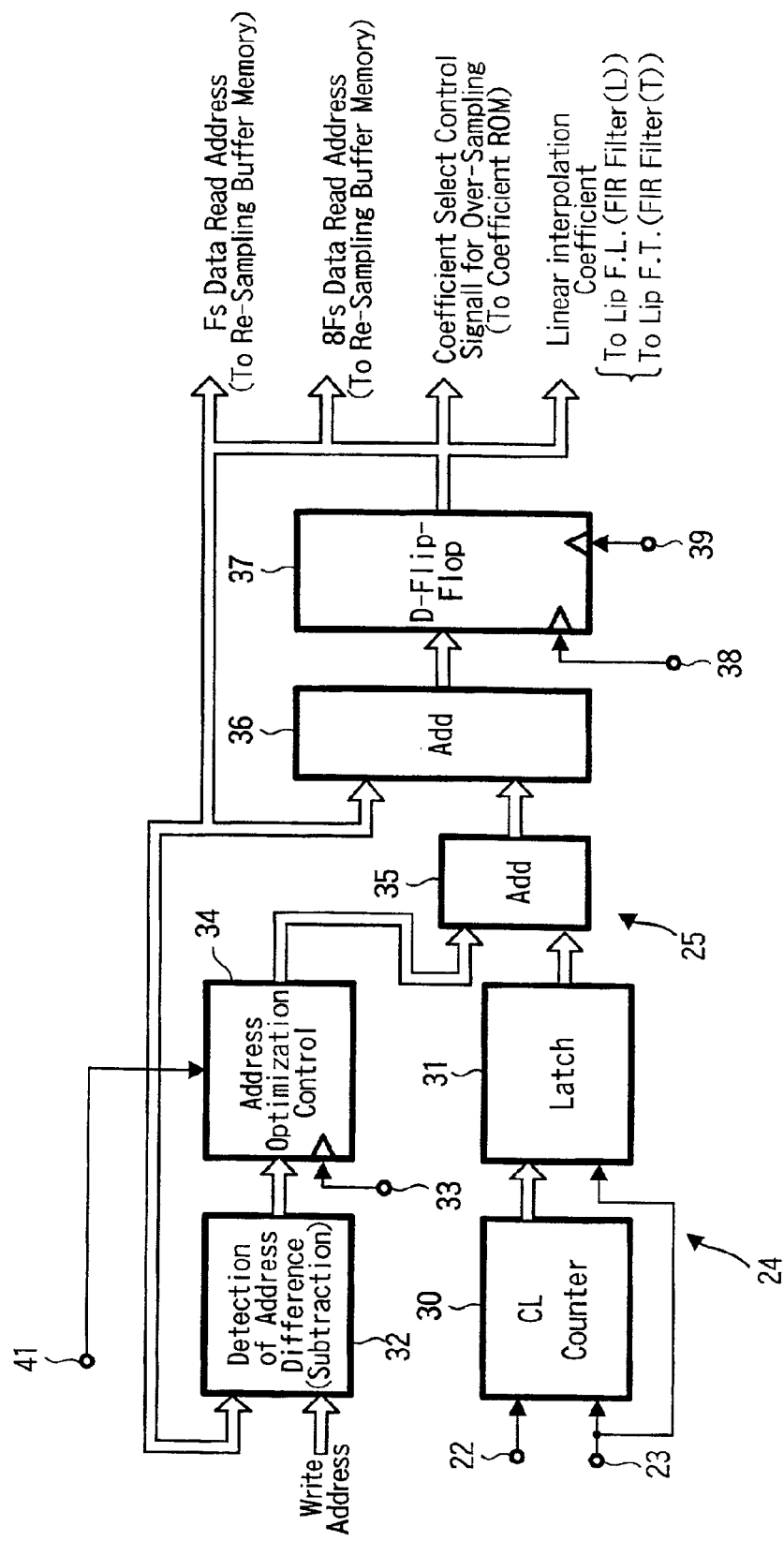
FIG. 3 is a block diagram illustrating the constitution of a memory address control unit according to the embodiment of the present invention.

The memory address control unit constituted by the sampling frequency ratio detector circuit 24 and the controller 25 will now be described with reference to FIG. 3.

The memory address control unit of this embodiment controls the read address of the re-sampling buffer memory 13 which is a ring buffer memory in which the difference of the read address from the write address arbitrarily changes to continuously record the data into, and to continuously reproduce the data from, the storage medium. The memory address control unit includes a sampling frequency ratio detector circuit 24 and a controller 25 which has an address difference detector circuit 32 for detecting a difference between the write address and the read address, and an address optimizing control circuit 34 for optimizing the read address so that the address difference detected by the address difference detector circuit 32 assumes an optimum value.

The sampling frequency ratio detector circuit 24 includes a counter 30 for counting the period t (=N·Tso) which is an integer times (N times) as long as the output sampling period Tso input through an input terminal 23 in response to an input master clock MCKi supplied through the input terminal 22, and a latch 31 for latching the count output from the counter 30 based upon the above-described period N·Tso.

The counter 30 counts the period N·Tso in response to the input master clock MCKi, and the counted result is latched by the latch 31 to find the present sampling frequency ratio R with the period t.

The controller 25 includes an adder circuit 35 for adding an output signal of the address optimizing control circuit 34 to the sampling frequency ratio R from the latch 31 depending upon the address difference detected by the address difference detector circuit 32, an adder circuit 36 for accumulating the added outputs of the adder circuit 35, and a flip-flop circuit 37, in addition to the address difference detecting circuit 32 and the address optimizing control circuit 34.

It is preferable that the flip-flop circuit 37 is a D-flip-flop circuit, and clock signals of 8Fso are supplied through an input terminal 38 in agreement with the sampling frequency 8Fso of the output signals of this embodiment. When the sampling frequency of the output signals is 4Fso or 2Fso, clock signals of 4Fso or 2Fso are supplied, as a matter of course. An initializing signal is supplied through an input terminal 39.

Figure 4:
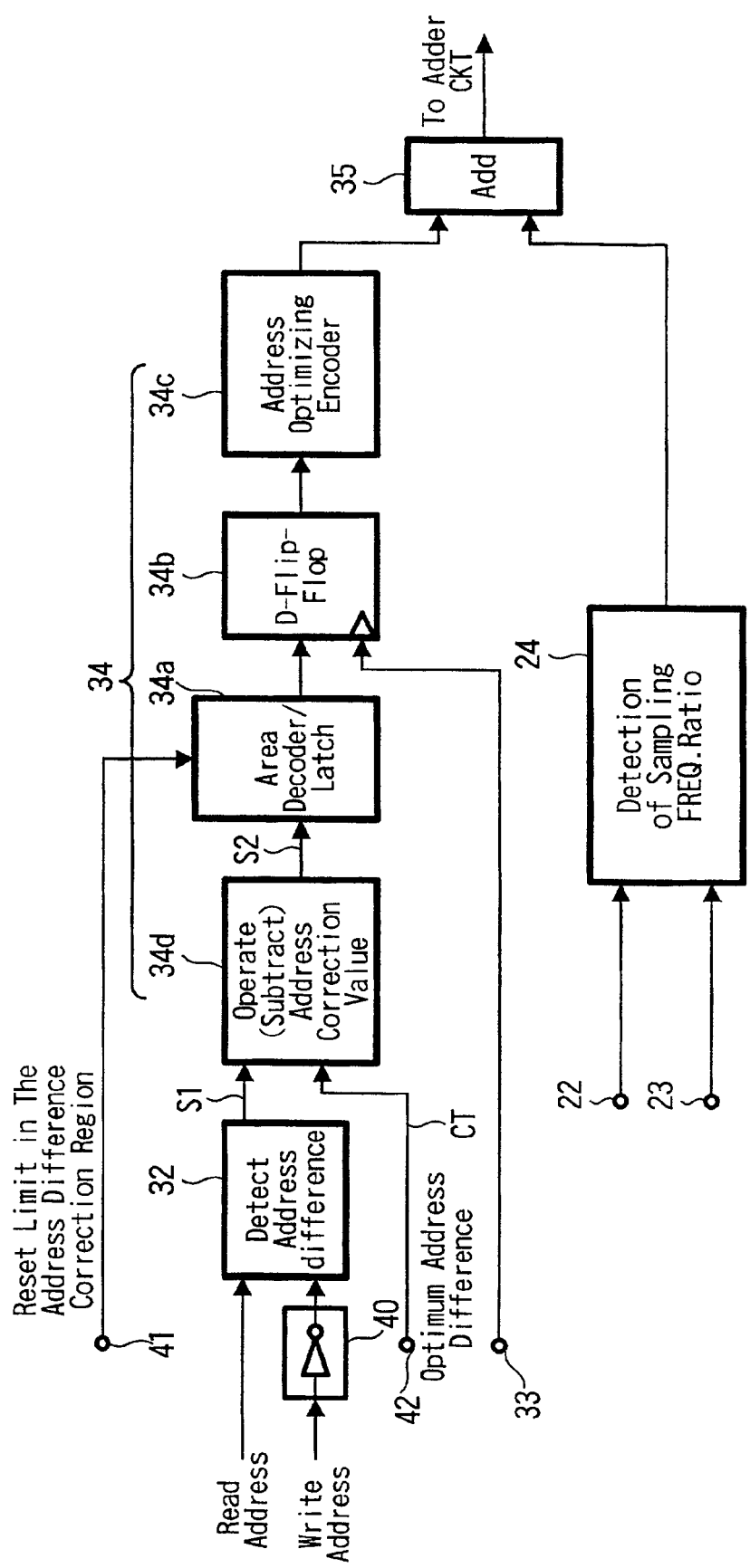
FIG. 4 is a block diagram illustrating the constitution of an address optimizing circuit according to the embodiment of the present invention.

The address difference detector circuit 32 adds a write address to a read address through an inverter 40 as shown in FIG. 4 to detect a difference between the read address and the write address. The difference between the read address and the write address serves as a scale representing the buffering allowance of the re-sampling buffer memory 13. When there is no address difference, the re-sampling buffer memory 13 overflows.

The address difference optimizing control circuit 34 optimizes the read address so as to control optimizing the address difference detected by the address difference detector circuit 32. As shown in FIG. 4, the address difference optimizing control circuit 34 includes an area decoder/latch 34a, a D-flip-flop 34b and an address optimizing encoder 34c. A limit reset signal for the address difference correction region is supplied from the controller 101 (see FIG. 19) of the audio amplifier apparatus 100 through a terminal 41, and is fed to the area decoder/latch 34a as shown in FIG. 4. The operation by the limit reset signal obtained through the terminal 41 will be described later.

Figure 6:
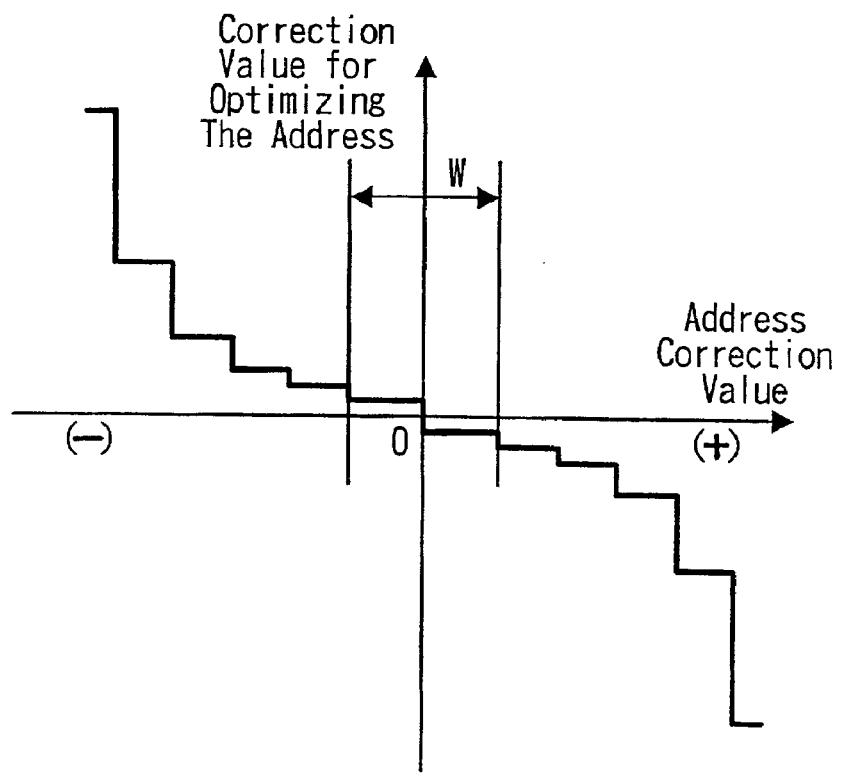
FIG. 6 is a diagram illustrating a relationship between the address difference and the correction value for optimizing the address according to the embodiment of the present invention.

In the address difference optimizing control circuit 34, an optimum address difference CT is subtracted from an address difference signal S1 detected by the address difference detector circuit 32, an address correction value S2 shown in FIG. 6 is output from an address correction value operation circuit 34d depending upon the subtracted value, and in which area the address correction value S2 lies is monitored by the area decoder/latch 34a and the D-flip-flop 34b being latched by a given period every time based on the data supplied from the terminal 33. Depending upon the monitored result, the address optimizing encoder 34c forms a correction value that is to be added through an adder circuit 35 to the sampling frequency ratio R detected by the sampling frequency ratio detector circuit 24.

In this case, a limitation is added to the address difference correction region or the limitation is reset depending upon the state of the limit reset signal for the address difference correction region supplied to the area decoder/latch 34a from the terminal 41. The individual cases will be described later in detail.

Figure 5:
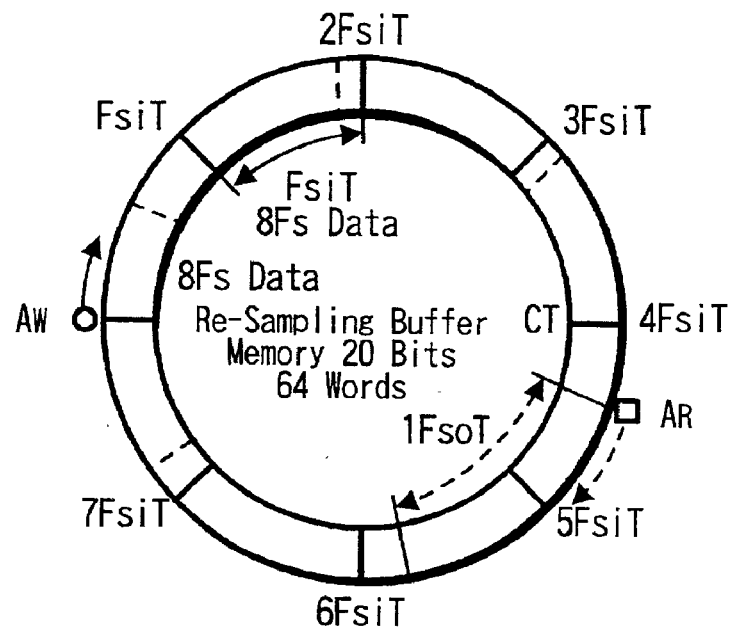
FIG. 5 is a block diagram schematically illustrating the constitution of a re-sampling buffer memory according to the embodiment of the present invention.

Referring, for example, to FIG. 5, the optimum address difference CT is so selected that the address difference maintains a phase difference of 180 degrees in the ring buffer memory in which the addresses for storing the data are in the form of a ring. That is, the write address AW and the read address AR are at the exact opposite positions on the ring, and the address difference is the greatest in whichever direction it is viewed.

In the address optimizing control circuit 34, the correction value added by the address optimizing encoder 34c to the sampling frequency R is increased when the read address is delayed and is decreased when the read address is advanced. The added output is accumulated by the adder circuit 36 and the D-flip-flop 37 shown in FIG. 3 to form a memory read address.

In the address optimizing control circuit 34, the address is regarded to be optimized when the address correction value S2 changes from a positive value to a negative value or from a negative value to a positive value. Then, the correction output is set to 0 to end the correction operation.

Here, as described above, a limitation is added to the address difference correction region or the limitation is reset depending upon the state of the limit reset signal for the address difference correction region supplied to the area decoder/latch 34a from the terminal 41. In the case of this embodiment, the address difference is controlled to assume an optimum value by forming a correction value for optimizing the address relying upon the address correction value S2 as shown in FIG. 6. Here, however, a range W of a predetermined width is set with 0 as a center, and the operation is varied in a manner as shown below in Table 1 in accordance with the state of the limit reset signal depending upon whether the address correction value S2 lies within the range W or outside the range W.

TABLE 1

| Address difference | Inside the range W | | Outside the range W | |
|---|---|---|---|---|
| Reset limitation of address difference correction region | Non-active | | Active | Non-active | Active |
| Operate address optimizing control circuit | Output zero correction value not to execute the optimization | | Output correction value until the sign of address correction value S2 is inverted to effect the optimization | |

That is, when the address correction value S2 assumes a value outside the range W shown in FIG. 6 even once, the address optimizing control circuit 34 continues to output the correction value until the sign of the address correction value is inverted to optimize the address regardless of the state of the limit reset signal obtained at the terminal 41. When the address correction value S2 lies within the range W shown in FIG. 6, the correction is effected until the sign of the address correction value S2 is inverted or the correction operation is limited depending upon the state of the limit reset signal obtained at the terminal 41.

This operation can also be controlled by an output of a reset-first set/reset circuit which produces a set signal under, for example, a condition where "the address correction value S2 lies outside the range W or the limit reset signal is active" and produces a reset signal under a condition where "the address correction value has inverted from the value of the previous time".

In the case of this embodiment, the limit reset signal supplied from the controller 101 of the audio amplifier apparatus 100 through the terminal 41 is such that the limitation on the address difference correction region is reset (i.e., no limit is imposed) for a predetermined period of time from the start of supplying the audio data to the audio amplifier apparatus 100, and the correction value is maintained to output until the sign of the address correction value S2 is inverted to effect the optimization operation. After the above-mentioned predetermined period of time has passed from the start of supplying the audio data to the audio amplifier apparatus 100, limitation on the address difference correction region is no longer reset (i.e., limitation is imposed), and the correction value is set to 0 when the address correction value lies within the range W so will not to effect the optimization operation.

Here, the predetermined period of time from the start of supplying the audio data is longer than, for example, a time from when the audio data are input until when the operation for converting the sampling frequency is stabilized in the circuit of the embodiment (concretely speaking, a time until the ratio of the sampling frequency for the input data and the sampling frequency for the output data is stabilized and the state of the optimized address difference stably continues). The period of time until stabilized may be from when the phase difference is a maximum between the write address and the read address in the buffer memory (i.e., the phase difference is close to 360 degrees) until when the phase difference becomes 180 degrees, which is the optimum value. The operation for converting the sampling frequency is stabilized after a time of, for example, about 200 milliseconds to about one second. Therefore, the optimization operation is effected by the correction operation without imposing limitation by producing a limit reset signal for only a period of time of not shorter than one second (e.g., about two seconds) from the start of supplying the audio data and, thereafter, the operation is effected in a state where the limitation is imposed by the limit reset signal.

The period in which the controller 101 in the audio amplifier apparatus 100 effects the correction without limitation by the limit reset signal may be the one in which the optimization operation is effected by executing the correction operation without limitation by the limit reset signal for a predetermined period of time after, for example, the switching on the power source circuit of the apparatus 100 instead of judging the input of the audio data. Thereafter, the operation may be effected under a state where limitation is imposed by the limit reset signal.

As a moment when the audio data are input, further, it may be regarded that the audio data are newly input even when the operation is effected for switching the audio data input to the amplifier apparatus 100; i.e., the optimization operation is effected by executing the correction operation without limitation by the limit reset signal for a predetermined period and, then, the operation may be effected in a state of being limited by the limit reset signal. Even when the sampling frequency for the audio data output from the audio signal source side is changed in addition to the change of input on the side of the amplifier apparatus 100, it may similarly be regarded that the input of audio data is newly started and the correction operation without limitation may be executed for only a predetermined period of time.

A predetermined period of time is not set but, instead, the optimization operation may be effected by executing the correction operation without limitation by the limit reset signal, for example, for a period of time from the start of input of data until the state of detecting the sampling frequency ratio by the sampling frequency ratio detector circuit 24 is stabilized. After stabilized, the operation may be effected in a state of being limited by the limit reset signal.

The state of writing the data into, and reading the data from, the re-sampling buffer memory 13 will be described with reference to the diagram of the ring buffer of FIG. 5. The re-sampling buffer memory 13 may be the 8Fs data re-sampling buffer memory of the image of the form of a ring having a capacity of 20 bits/64 words as shown in FIG. 5. This memory address control circuit controls the read address AR in such a manner that the data write address AW and the read address AR operate maintaining a difference of 32 words and a phase difference of 180 degrees. The memory address control circuit has eight FsiT data section addresses, and has a maximum absolute point CT at 4 FsiT.

Described below next is an interpolation control unit comprising the sampling frequency ratio detector circuit 24 and the controller 25.

The controller 25 accumulates the sampling frequency ratios R supplied from the sampling frequency ratio detector circuit 24 through the adder circuit 36 and the flip-flop circuit 37, forms an address for reading the data for the re-sampling buffer memory 13, in addition forms through the adder circuit 36 and the flip-flop circuit 37, for the interpolation processing circuit 14, a signal for selecting a factor for over-sampling as well as leading and trailing linear interpolation factors LIP.F.L and LIP.F.T.

The read address, control signal for selecting the factor for over-sampling, and linear interpolation factors, are output from the controller 25 as data in a range of higher-order bits, in a range of intermediate-order bits and in a range of lower-order bits on a sequence of data. Among them, the control signal for selecting the factor for over-sampling and the linear interpolation factors are supplied to the interpolation processing circuit 14 to control the interpolation processing in the interpolation circuit 14.

Referring to FIG. 2, the interpolation circuit 14 includes a leading FIR filter 15 for the leading linear interpolation filter and a trailing FIR filter 17 for the trailing linear interpolation filter for over-sampling and linearly interpolating the data read out from the re-sampling buffer memory 13 in response to the data read address from the controller 25, and further includes a factor ROM 16 for supplying the over-sampling factors to the leading FIR filter 15 for the leading linear interpolation factor and the trailing FIR filter 17 for the trailing linear interpolation factor, and an adder 18 for adding up an output signal of the leading FIR filter 15 for the leading linear interpolation factor and an output signal of the trailing FIR filter 17 for the trailing linear interpolation factor. The factor ROM 16 has, for example, thirty-two 24-bit/7-word over-sampling factors.

Figure 7A:
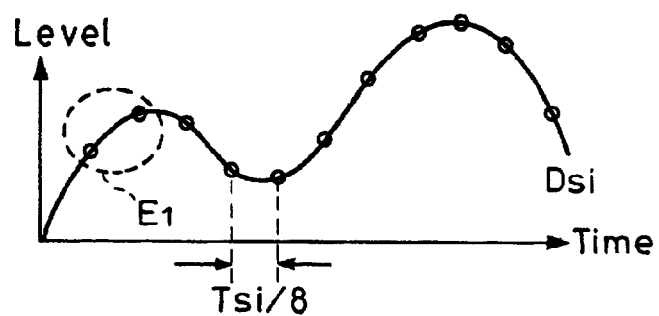
FIG. 7 is a diagram illustrating the operation of an interpolation processing circuit according to the embodiment of the present invention.

The operation of the interpolation circuit 14 will now be described with reference to FIG. 7. In response to a read address supplied from the controller 25, the re-sampling buffer memory 13 supplies, for example, seven data for every Tsi/8 as shown in FIG. 7(A) to the leading FIR filter 15 for the leading linear interpolation factor and the trailing FIR filter 17 for the trailing linear interpolation factor. The leading FIR filter 15 for the leading linear interpolation factor and the trailing FIR filter 17 for the trailing linear interpolation factor, multiply, for example, 7 data supplied from the re-sampling buffer memory 13 by, for example, 7 factors read out from the factor ROM 16 to produce 256 Fsi data, respectively.

Figure 7B:
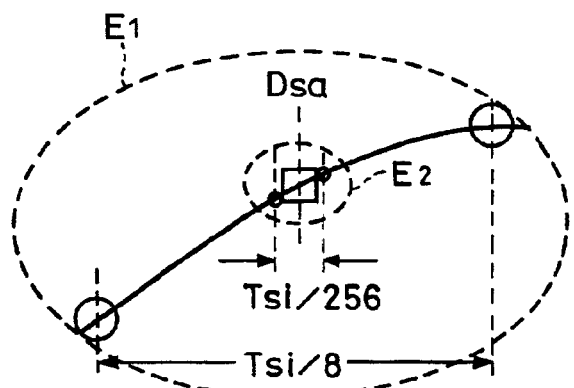

FIG. 7(B) shows two neighboring data among the 256 Fsi data. A region E1 surrounded by a broken line in FIGS. 7(A) and 7(B) stands for Tsi/8, and a region E2 surrounded by a broken line in FIG. 7(B) shows two neighboring data among 256 Fsi maintaining a gap of Tsi/256.

Next, the leading FIR filter 15 for the leading linear interpolation factor and the trailing FIR filter 17 for the trailing linear interpolation factor, multiply the two neighboring data maintaining a gap of Tsi/256 by the linear interpolation factor supplied from the controller 25. The data are then added up through the adder 18 to effect the linear interpolation as shown in FIG. 7(C).

Figure 7C:
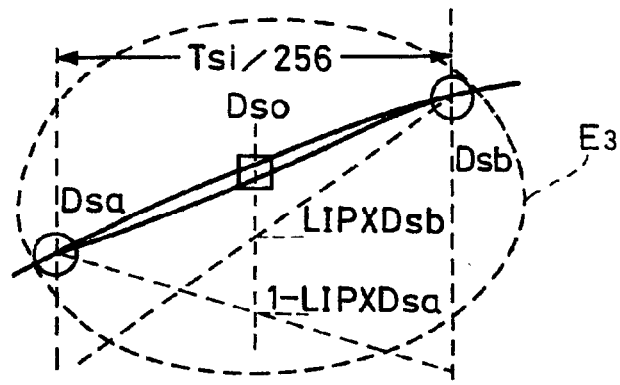
Figure 7D:
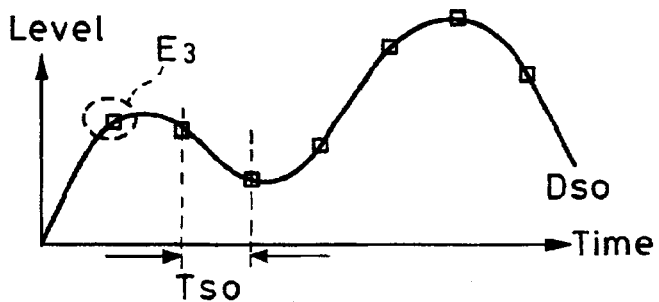

By repeating the above-mentioned over-sampling and the linear interpolation, the sampling frequency conversion circuit of this embodiment forms data Dso of a sampling frequency Fso as shown in FIG. 7(D).

The linear interpolation will now be explained. The linear interpolation factors include the leading linear interpolation factor LIP.F.L and the trailing linear interpolation factor LIP.F.T. The linear interpolation factors are generated using lower-order bits, e.g., 12 bits of a data string (data value) produced by accumulating the values of the sampling frequency ratio by the address control signal generating circuit (controller) 25. Specifically, the leading interpolation factor LIP.F.L is given as a complement of 1 of the lower 12 bits, while the trailing linear interpolation factor LIP.F.T is given as the lower 12 bits.

FIG. 7(C) shows the data Dso obtained by multiplying, by the above linear interpolation factor, the two data Dsa and Dsb maintaining a gap of Tsi/256 in a region E3 surrounded by a broken line.

The interpolation circuit 14 produces the data 8Fso which is supplied to the re-sampling frequency signal output circuit 19. The re-sampling frequency signal output circuit 19 thins out the data 8Fso to transform it into 4Fso or 2Fso. Any one of 8Fso, 4Fso or 2Fso is selected by the multiplexer 19a.

A band limit filter 20 works not to generate aliasing noise in the output data. When the input sampling frequency Fsi is higher than the output sampling frequency Fso, the aliasing noise may generate. Therefore, the output signals from the multiplexer 19a are limited for their band.

Upon being provided with the sampling frequency conversion circuit which is constituted to operate as described above, the audio amplifier apparatus 100 of this embodiment receives the multi-channel digital audio data, converts the sampling frequency when it is necessary to convert the sampling frequency of the input data so that the data are output in the equal phase, and no deviation occurs in the phase (timing) among the channels.

That is, during the predetermined period of time from the start of input of data to the sampling frequency conversion circuit, the optimization operation is conducted due to the limit reset signal in the address difference correction region until the sign of the address correction value is inverted. Therefore, the difference between the write address and the read address in the buffer memory 13 is strictly optimized up to the state closest to the address correction value 0 shown in FIG. 6. Upon effecting the optimization, the difference between the write address and the read address reaches a phase difference of nearly 180 degrees. In all of the channels treated by the audio amplifier apparatus 100, therefore, the delay time of the input data becomes equal and no phase difference occurs among the channels even when the audio data of two channels or more channels are treated.

Here, if the strict control operation for optimizing the address difference in the buffer memory 13 is continued, oscillation may take place at positions spanning across the address difference 0 in a manner that the address difference varies up and down. In this embodiment, however, after the operation is stabilized, the correction value is forcibly brought to 0 within a predetermined range W to inhibit the optimization operation. Therefore, the operation for changing the sampling frequency is stably carried out while preventing the oscillation. After the operation for changing the sampling frequency is once stabilized, there basically occurs no change in the address difference between the write address and the read address in the buffer memory 13 despite the optimization operation is not effected unless the sampling frequency for the input data changes. Therefore, the optimized address difference is maintained. In other words, there is maintained a state where no difference occurs in the phase among the channels.

In this embodiment, further, since no phase difference occurs in the data among the channels of which the sampling frequency is changed, there is no need of effecting a complex control processing for synchronizing the operations for converting the sampling frequency among the channels, and the control processing is executed using a simply constituted circuitry.

In the sampling frequency conversion apparatus of the above-mentioned embodiment, the invention was applied to the sampling frequency conversion unit required by the audio amplifier apparatus that effects the amplification by forming the PWM waves. The invention, however, can also be applied to the sampling frequency conversion unit required by other audio equipment or can further be applied even when a single equipment is constituted for executing the operation for converting the sampling frequency only. The invention can be further applied even to a case where it is necessary to convert the sampling frequency for the digital data other than the audio data.

In the above-mentioned embodiment, the invention was applied when the phase difference (time difference) was to be brought into synchronism among a plurality of sampling frequency conversion units like the case of converting the audio data of a multiplicity of channels. Even when the sampling frequency for the audio data of, for example, a single channel is to be converted by a single sampling frequency conversion unit, the invention can be applied to control the time difference between the input and the output caused by the conversion into a suitable value. Thus, the invention is not limited to the apparatus for processing the data of a multiplicity of channels only.

In the above-mentioned embodiment, the interior of the sampling frequency conversion unit was constituted by a hardware that executes a variety of operations. However, the address difference in the buffer memory may be controlled by a software that executes a similar control operation.

The time values for optimization described in the above embodiment are only examples which are not to limit the invention. The time for optimization may be suitably selected depending upon the circuit constitution to which the invention is applied and upon the data to be treated.

While the address difference is being optimized in the above embodiment, further, it is judged that the address difference is optimized when the polarity of a value comparing the optimum address difference with the real address difference is inverted. However, the address difference may be judged to be optimum by any other processing.

According to the present invention, the difference between the write address and the read address is optimized during the predetermined period of time from the start of supplying the input data; i.e., the address difference is optimized within the predetermined period of time, and the phase difference (time difference) between the input data and the output data becomes nearly constant maintaining the optimum value. After the predetermined period of time has passed, the operation is effected for optimizing the address difference in a state where a predetermined limitation is imposed. In a state where the output of data for which the sampling frequency is converted is stabilized, the writing of data into, and the reading of data from, the storage means are stably carried out. Therefore, even when the address difference is optimized by imposing a predetermined limitation, the address difference can, after all, be suppressed from changing. Therefore, the oscillation does not occur, that may result when the operation for optimizing the read address continues, and the data having a sampling frequency that is converted are stably output in a state where the address difference is set constant.

Here, the predetermined period of time, from the start of supplying the input data, in which no limitation is imposed in optimizing the address difference is selected to be longer than a time required for stabilizing the difference between the input data sampling frequency and the output data sampling frequency in order to stably change the sampling frequency. Therefore, after the conversion of sampling frequency becomes surely stabilized, a predetermined limitation is imposed on optimizing the address difference, and the operation is reliably executed for setting the address difference to be constant.

A moment of switching the input data is included in the moment where the supply of input data starts. Even when the input data are switched, therefore, the processing effectively works to control the address difference to become constant.

As a control operation for optimizing the address difference without imposing limitation, the address difference is brought close to an optimum value while comparing the address difference with the optimum value. Further, as a control operation for optimizing the address difference imposing a predetermined limitation, the address difference is brought to lie within a predetermined range with the optimum value as a center. Thus, the address difference can be favorably optimized.

Further, as a control operation for bringing the address difference close to the optimum value by comparing it with the optimum value by the address control means, the address difference is judged to be optimum at a moment when a value of the changing address exceeds the optimum value or becomes smaller than the optimum value. It is thus allowed to judge a moment at which the address difference assumes the optimum value relying upon a simple processing for judgement.

Even when the sampling frequency converters of the invention are provided in a plural number and input digital data are supplied to each of them, the optimization operation is not effected after the address difference is optimized in all of the sampling frequency converters after the passage of a predetermined period of time from the start of supplying the input data. Therefore, the oscillation does not occur, that may result when the operation for optimizing the read address is continued. Besides, no phase difference exists in the data output from the individual sampling frequency converters, and there is no disturbance in the sound field when the multi-channel audio data are reproduced.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A sampling frequency conversion apparatus for converting input data of a first sampling frequency into output data of a second sampling frequency, comprising:
   storage means into which said input data are continuously written and read-out;
   interpolation processing means for interpolating the data read-out from said storage means to obtain the data of said second sampling frequency;
   address difference detecting means for detecting an address difference between a writable address and a readable address in said storage means; and
   address control means for performing an optimization operation optimizing the address difference detected by said address difference detecting means, wherein
   said address control means adaptively sets a limitation on the optimizing operation, wherein
   said address control means works so as not to execute the optimization operation when the address difference detected by said address difference detecting means falls within a predetermined range after passage of a predetermined period of time from a starting time when the input data is supplied.

2. A sampling frequency conversion apparatus for converting input data of a first sampling frequency into output data of a second sampling frequency, comprising:
   storage means into which said input data are continuously written and read-out;
   interpolation processing means for interpolating the data read-out from said storage means to obtain the data of said second sampling frequency;
   address difference detecting means for detecting an address difference between a writable address and a readable address in said storage means; and
   address control means for performing an optimization operation optimizing the address difference detected by said address difference detecting means, wherein
   said address control means adaptively sets a limitation on the optimizing operation, wherein
   said address control means works so as not to execute the optimization operation when the address difference detected by said address difference detecting means falls within a predetermined range after passage of a predetermined period of time from a time when the power source circuit is switched on.

3. The sampling frequency conversion apparatus according to claim 2 wherein
   said predetermined period of time is longer than a time required for stabilizing a ratio between the first sampling frequency of the input data and the second sampling frequency of the output data after a start of supplying said input data.

4. A sampling frequency conversion apparatus for converting input data of a first sampling frequency into output data of a second sampling frequency, comprising:
   storage means into which said input data are continuously written and read-out;
   interpolation processing means for interpolating the data read-out from said storage means to obtain the data of said second sampling frequency;
   address difference detecting means for detecting an address difference between a writable address and a readable address in said storage means; and
   address control means for performing an optimization operation optimizing the address difference detected by said address difference detecting means, wherein
   said address control means adaptively sets a limitation on the optimizing operation, wherein
   said address control means performs a control operation to bring said address difference close to a predetermined optimum value imposing no limitation when a predetermined period of time has not been passed after a start of supplying said input data or when the address difference detected by said address difference detector means falls outside of a predetermined range, wherein
   said address control means executes the control operation by bringing the address difference close to the predetermined optimum value by judging that a moment at which the changing address difference value exceeds the predetermined optimum value or becomes smaller than the predetermined optimum value, is the moment of an optimum address difference.

5. A sampling frequency conversion apparatus having a plurality of sampling frequency conversion means for converting a first sampling frequency of input data into a second sampling frequency to obtain output data, wherein
   each of said plurality of sampling frequency conversion means includes:
   storage means into which said input data are continuously written and read-out;
   interpolation processing means for interpolating the data read out from said storage means to obtain the data of said second sampling frequency;
   address difference detecting means for detecting an address difference between a writable address and a readable address in said storage means;
   and address control means for performing an optimizing operation optimizing the address difference detected by said address difference detection means, wherein
   said address control means works so as not to execute the optimization operation when the address difference detected by the address difference detector means in each of said plurality of sampling frequency conversion means falls within a predetermined range after passage of a predetermined period of time from a start of supplying said input data, thereby to eliminate a time difference between the output data from said plurality of sampling frequency conversion means.

6. The sampling frequency conversion apparatus according to claim 5, wherein said predetermined period of time is longer than a time required for stabilizing a ratio between the first sampling frequency of the input data and the second sampling frequency of the output data after a start of supplying the input data.

7. The sampling frequency conversion apparatus according to claim 5, wherein said address control means performs a control operation to bring said address difference close to a predetermined optimum value when a predetermined period of time has not passed after the start of supplying said input data or when the address difference detected by said address difference detecting means falls outside of the predetermined range.

8. The sampling frequency conversion apparatus according to claim 7, wherein said address control means executes the control operation by bringing the address difference close to the predetermined optimum value by judging that a moment at which the changing address difference value exceeds the predetermined optimum value or becomes smaller than the predetermined optimum value, is the moment of an optimum address difference.

* * * * *